(12) United States Patent
Lang et al.

(10) Patent No.: US 10,225,933 B2
(45) Date of Patent: Mar. 5, 2019

(54) ORGANIC LIGHT EMITTING DIODE AND ARRANGEMENT HAVING AN ORGANIC LIGHT EMITTING DIODE

(71) Applicant: OSRAM OLED GmbH, Regensburg (DE)

(72) Inventors: Erwin Lang, Regensburg (DE); Heiko Heppner, Koefering (DE)

(73) Assignee: OSRAM OLED GMBH, Regensburg (DE)

( * ) Notice: Subject to any disclaimer, the term of this patent is extended or adjusted under 35 U.S.C. 154(b) by 79 days.

(21) Appl. No.: 15/294,592

(22) Filed: Oct. 14, 2016

(65) Prior Publication Data
US 2017/0111993 A1 Apr. 20, 2017

(30) Foreign Application Priority Data
Oct. 14, 2015 (DE) ........................ 10 2015 117 486

(51) Int. Cl.
*H05K 1/14* (2006.01)
*F21V 23/06* (2006.01)
(Continued)

(52) U.S. Cl.
CPC .............. *H05K 1/147* (2013.01); *F21K 9/20* (2016.08); *F21V 23/06* (2013.01);
(Continued)

(58) Field of Classification Search
CPC ........ H05K 1/147; H05K 1/111; H05K 1/189; H05K 2201/055; H05K 2201/10106;
(Continued)

(56) References Cited

U.S. PATENT DOCUMENTS

| | | | | |
|---|---|---|---|---|
| 2015/0345757 A1* | 12/2015 | Ngai | .................. | F21V 21/35 |
| | | | | 362/249.01 |
| 2015/0354792 A1* | 12/2015 | Chien | .................. | F21V 17/002 |
| | | | | 362/158 |
| 2016/0088726 A1* | 3/2016 | Jeon | .................. | G02F 1/13452 |
| | | | | 361/749 |

FOREIGN PATENT DOCUMENTS

DE  60306721 T2  7/2007
JP  2009187841 A  8/2009

OTHER PUBLICATIONS

ORBEOS™ for OLED Light Lead (Pb) Free—RoHS Compliant—RDW-046, OSRAM Datasheet (POLLUS with T-Flex-PCB), Mar. 2012, 9 pages.
ORBEOS™ RDW-046, OSRAM Datasheet (TS-POLLUX), Aug. 2014, 1 page.

* cited by examiner

*Primary Examiner* — Laura Tso
(74) *Attorney, Agent, or Firm* — McDermott Will & Emery LLP (57) ABSTRACT

In one embodiment, the organic light emitting diode (1) comprises a carrier substrate (2) having an organic layer stack for producing light. The organic light emitting diode (1) is electrically connectable via at least one connector (3) as intended. The connector (3) has two main sides (32) situated opposite one another that each have at least two electrical contact pads (31) of the connector (3) located on them. As seen in a cross section perpendicular to the main sides (32) and perpendicular to an insertion direction (x) of the connector (3), the contact pads (31) are arranged both geometrically and with electrical point symmetry, so that incorrect-polarity protection against incorrect electrical connection of the organic light emitting diode (1) is attained.

16 Claims, 10 Drawing Sheets

(51) Int. Cl.

| | | |
|---|---|---|
| *H01L 51/00* | (2006.01) | |
| *H01R 12/79* | (2011.01) | |
| *H05K 1/11* | (2006.01) | |
| *H05K 1/18* | (2006.01) | |
| *H05K 3/36* | (2006.01) | |
| *F21K 9/20* | (2016.01) | |
| *F21Y 115/15* | (2016.01) | |
| *H01L 51/52* | (2006.01) | |
| *H05K 1/02* | (2006.01) | |
| *H05K 1/16* | (2006.01) | |

(52) U.S. Cl.
CPC .......... *H01L 51/0097* (2013.01); *H01R 12/79* (2013.01); *H05K 1/111* (2013.01); *H05K 1/189* (2013.01); *H05K 3/361* (2013.01); *F21Y 2115/15* (2016.08); *H01L 51/5203* (2013.01); *H01L 2251/5338* (2013.01); *H05K 1/028* (2013.01); *H05K 1/117* (2013.01); *H05K 1/16* (2013.01); *H05K 2201/055* (2013.01); *H05K 2201/10106* (2013.01); *H05K 2201/10325* (2013.01); *H05K 2203/168* (2013.01)

(58) Field of Classification Search
CPC .......... H05K 2201/10325; F21V 23/06; H01L 51/0097; H01L 2251/5338
See application file for complete search history.

ORGANIC LIGHT EMITTING DIODE AND ARRANGEMENT HAVING AN ORGANIC LIGHT EMITTING DIODE

An organic light emitting diode is specified. Furthermore, an arrangement having such a light emitting diode is specified.

An object to be achieved is to specify an organic light emitting diode that is connectable efficiently such that incorrect polarity is prevented.

This object is achieved by, inter alia, an organic light emitting diode having the features of patent claim 1. Preferred developments are the subject matter of the remainder of the claims.

According to at least one embodiment, the organic light emitting diode, OLED for short, comprises a carrier substrate. The carrier substrate has an organic layer stack located on it for producing light. The light may be colored light such as blue, green, yellow, orange or red light. Similarly, it is possible for the light produced in the layer stack and emitted by the light emitting diode to be light of mixed color, particularly white light.

According to at least one embodiment, the carrier substrate is that component of the organic light emitting diode that mechanically supports and carries the latter. The carrier substrate may be a mechanically rigid substrate that does not or does not significantly bend when the organic light emitting diode is used as intended. Alternatively, it is possible for the carrier substrate and preferably also the whole light emitting diode to be of mechanically flexible design.

According to at least one embodiment, the organic light emitting diode contains one or more connectors. The at least one connector makes electrical contact with and connects the organic light emitting diode as intended. Similarly, it is possible for the at least one connector to implement mechanical retention of the organic light emitting diode. In particular, it is possible for the organic light emitting diode to be mechanically retained exclusively via the at least one connector.

According to at least one embodiment, the connector has two main sides situated opposite one another. The main sides are preferably the two largest sides or faces of the connector. It is not necessarily a requirement for the main sides to be of planar and/or flat design, and curved main sides are similarly possible. Preferably, however, the main sides are flat in shape at least on average.

According to at least one embodiment, each of the main sides of the connector has at least two electrical contact pads located on it. The electrical contact pads make external electrical contact with the organic light emitting diode. In this case, at least one of the electrical contact pads on each of the main sides is preferably configured as an anode and at least one contact pad on each of the main sides is configured as a cathode.

According to at least one embodiment, the contact pads are arranged with point symmetry on the main sides. In this case, the point symmetry preferably relates to a single, common point, with respect to which all electrical contact pads are then arranged with point symmetry. The point symmetry preferably exists in a cross section perpendicular to the main sides and also perpendicular to an insertion direction. Along the insertion direction, the connector is insertable into a receiving socket as intended. A point-symmetric arrangement of this kind for the contact pads provides incorrect-polarity protection against incorrect electrical connection of the connector and hence protection against incorrect electrical polarity on external connection of the light emitting diode.

In at least one embodiment, the organic light emitting diode comprises a carrier substrate having an organic layer stack for producing light. The organic light emitting diode is electrically connectable as intended via at least one connector. The connector has two main sides situated opposite one another so that each have at least two electrical contact pads of the connector located on them. As seen in a cross section perpendicular to the main sides and perpendicular to an insertion direction of the connector, the contact pads are arranged both geometrically and with electric point symmetry, so that incorrect-polarity protection against incorrect electrical connection of the organic light emitting diode is attained.

Examples of options for making external electrical contact with an organic light emitting diode consist in soldering or otherwise permanently securing electrical lines directly to an organic light emitting diode. If connectors are used for making contact with an organic light emitting diode, then care should be taken to ensure that the organic light emitting diode is connected with the correct electrical polarity, since otherwise there is the threat of damage or destruction of the light emitting diode.

In the case of connectors, incorrect-polarity protection for an organic light emitting diode, which is usually operated with DC current, is attainable through a special geometry for a connector, for example, so that the connector is insertable only in a single manner. Geometric structures of this kind for a connector to prevent incorrect insertion are comparatively expensive to manufacture, however. Additionally, it may be necessary, for example for reasons of space, to twist the connector relative to a connection socket in order to insert the connector correctly. In the case of the connector described here for the organic light emitting diode, correct electrical connection is ensured in two positions, rotated through 180°, relative to an axis of rotation parallel to an insertion direction of the connector. This means that no geometric alterations to the connector are necessary that allow it to be inserted only in one particular position. Hence, inexpensive components such as flexible printed circuit boards, for example, can be used for the connector, without recourse to injection-molded components, for example. This means that a particularly space-saving connector is also implementable.

According to at least one embodiment, the connector is a printed circuit board, preferably a flexible printed circuit board. The printed circuit board is mounted on and/or against the carrier substrate. In addition, the printed circuit board is preferably of one-piece design. Between the connector and the carrier substrate, there are particularly no further components required in order to increase distance, such as an additional electrical cable or an adapter. Between the printed circuit board, which comprises the connector, and the carrier substrate, there is preferably just an electrical and/or mechanical connecting means that mechanically and/or electrically connects the connector to the carrier substrate. By way of example, the printed circuit board is mounted on the carrier substrate by means of an anisotropically electrically conductive adhesive or an anisotropically electrically conductive adhesive film, also referred to as anisotropically conductive film or ACF for short.

In particular, the connector is irreversibly attached to the carrier substrate so that the connector does not unstick from the carrier substrate in the intended use of the organic light emitting diode.

According to at least one embodiment, the connector juts out from the carrier substrate, as seen in plan view, on precisely one or on precisely two sides. When the connector(s) jut(s) out from the carrier substrate on two sides, they are preferably opposite one another on both sides, as seen in plan view, and do not directly adjoin one another.

According to at least one embodiment, the electrical contact pads, when rotated through 180° about the axis of rotation, which preferably runs parallel to the insertion direction, have the same kind of electrical functionality, and electrical contact pads having the same kind of functionality when rotated through 180° about the axis of rotation are mapped to one another. In other words, the contact pads are mounted both electrically and geometrically symmetrically in respect of a rotation through 180° about the axis of rotation. Hence, there are two insertion positions and insertion options for the connector into a receiving socket, which are electrically and preferably also mechanically equivalent to one another. This is associated particularly with the following: if one end of each of the connectors is held in the same direction, then electrical contact pads having the same kind of functionality are successive in the same order, regardless of which side of the connector is situated at the top. By way of example, on both main sides, as seen in plan view, an anode contact pad follows a cathode contact pad from left to right.

According to at least one embodiment, both the carrier substrate and the connector are of mechanically flexible design. By way of example, mechanically flexible means that nondestructive and preferably also reversible bending with bending radii of 40 mm or less is implementable.

According to at least one embodiment, the connector or all connectors is/are mounted along a central axis of the carrier substrate. Preferably, the connector or the connectors is/are also located on the central axis. By way of example, the central axis is an axis of symmetry or mirror-image axis for the carrier substrate, as seen in plan view.

According to at least one embodiment, a contour of the carrier substrate, together with a contour of the connector, as seen in plan view, does not change when rotated about the central axis through 180°. In other words, the contour of the whole organic light emitting diode, as seen in plan view, is then rotationally symmetric in respect of a rotation through 180° about the central axis. The same can also apply for a 180° rotation about a transverse axis, the transverse axis preferably being oriented perpendicular to the central axis and parallel to main sides of the carrier substrate. The insertion direction of the connector runs parallel to the central axis and hence perpendicular to the transverse axis, in particular. The transverse axis may be shorter or longer than the central axis.

According to at least one embodiment, the organic light emitting diode contains precisely two of the connectors. In this case, the connectors are, as seen in plan view, located preferably on opposite sides along the central axis and jut out from the carrier substrate preferably exclusively as an extension to and on the central axis. Such an arrangement allows the organic light emitting diode to be electrically connectable on two opposite sides, as seen in plan view. Such an arrangement of the connectors allows simple implementation of electrical interconnections, particularly series circuits, of the organic light emitting diode.

According to at least one embodiment, the organic light emitting diode has multiple electrically individually actuatable light emitting segments. By way of example, a number of the segments is at least two or at least three and/or no more than 20 or ten or five. The segments preferably each have a relatively large light emitting area that is at least 0.5 $cm^2$ or 2 $cm^2$ or 5 $cm^2$, for example. In particular, the light emitting segments are not image points or pixels, as used in a display.

According to at least one embodiment, there are on the connector, for each of the segments, as seen in cross section, two electrical contact pads that are arranged with point symmetry and configured for individual actuation of the associated segment. Of the two contact pads, each one is located on each of the main sides of the connector in this arrangement. The light emitting segments can have a common electrical contact, for example a common cathode. In this case, the segments are then electrically individually actuatable via the anodes. In other words, the segments are directly electrically addressable via the connector only, without intermediate electronics and without an actuating chip in the light emitting diode. The organic light emitting diode may therefore be free of additional actuating electronics, for example for processing a serial input signal.

According to at least one embodiment, at least one of the connectors or all connectors is/are of geometrically short design. Short may mean that the relevant connector juts out from the carrier substrate by no more than three times or twice an average width of the connector and/or of the carrier substrate, as seen in plan view. In particular, the connector is not of cable-like or ribbon-like design. In this case, one end of the connector is preferably not or not significantly movable relative to the carrier substrate.

According to at least one embodiment, at least one of the connectors or all connectors is/are of geometrically long design. Long may mean that the relevant connector juts out from the carrier substrate by at least five times or ten times or 20 times an average width of the connector and/or of the carrier substrate, as seen in plan view. In other words, the connector may be of similar design to a ribbon cable. Such comparatively long design of the connector allows the connector to be nondestructively and reversibly twistable through at least 90° or 180° or 360° about an axis of rotation parallel to the insertion direction.

According to at least one embodiment, the connector is of narrow design, relative to the carrier substrate. In this case, a width of the connector, in a direction parallel to a corresponding width of the carrier substrate, is preferably no more than 30% or 20% and/or at least 5% or 10% of the width of the carrier substrate.

According to at least one embodiment, the connector contains precisely one or multiple insertion regions. The at least one insertion region is configured to be inserted into a receiving socket completely. It is possible for the electrical contact pads to be exposed just in the insertion region or just in a portion of the insertion region and to be covered by an electrical insulation in remaining regions of the connector. This applies particularly if the connector is a flexible printed circuit board.

According to at least one embodiment, the precisely one single insertion region of the connector comprises all of the contact pads. Along the insertion direction, the connector and the insertion region preferably have a constant, invariable geometrical extent in this case. In other words, there will then not be multiple insertion pins in the insertion region, as is the case with a power connector for a power outlet, but just a single, contiguous and two-dimensional insertion region on which the electrical contact pads are mounted, for example in a manner similar to a USB connector.

According to at least one embodiment, the connector has at least one electrically insulating base material, for example FR-4. The base material has the contact pads applied to it on the two opposite main sides, which are, in particular, flat on average. In this case, the contact pads are preferably metallizations that are produced on the base material. Such metallizations are open at least or exclusively in the insertion region. In this case, the contact pads, particularly the metallizations, can terminate flush with the electrically insulating base material in a direction perpendicular to the main sides, can jut out from the base material in a raised manner, or may be recessed in the base material, so that the base material juts out from the contact pads in a direction perpendicular to the main faces.

According to at least one embodiment, the connector is of one-piece design from a printed circuit board, particularly a flexible printed circuit board. In this case, it is possible for the connector to be U-shaped or V-shaped or ⊔-shaped as seen in at least one cross section. In this case, the carrier substrate is, in places, located between two subregions of the connector, likewise as seen in cross section in particular perpendicular to the luminous area.

According to at least one embodiment, the insertion region of the connector overlaps the carrier substrate, as seen in plan view. That is to say that both the connector and the carrier substrate are then configured for insertion into a receiving socket.

According to at least one embodiment, a printed circuit board of the connector is folded over a lateral face of the carrier substrate. In other words, the printed circuit board is then bent such that it is located both on the carrier reverse and on the side with the luminous area.

Furthermore, an arrangement is specified. The arrangement preferably comprises at least one organic light emitting diode, as specified in conjunction with one or more of the aforementioned embodiments. Features of the arrangement are therefore also disclosed for the organic light emitting diode, and vice versa.

In at least one embodiment, the arrangement contains one or more organic light emitting diodes. Moreover, the arrangement contains one or more receiving sockets. The light emitting diode is in electrical contact, and preferably also mechanically retained, via the receiving socket.

According to at least one embodiment, the light emitting diode is inserted into the receiving socket such that incorrect polarity is prevented, and reversibly. A receiving socket of this kind and a light emitting diode having a corresponding connector also allow an end user to subsequently remove the light emitting diode again and replace it with a substitute light emitting diode, for example.

According to at least one embodiment, the receiving socket has a connection opening, as seen in plan view. The connection opening extends from one end of the receiving socket into the receiving socket in a direction parallel to the insertion direction.

According to at least one embodiment, the receiving socket has electrical pads that are located in the connection opening. As seen in a plan view of the connection opening, the electrical pads are preferably arranged with point symmetry. This can mean that there are, in the connection opening, on opposite sides, pads having the same kind of electrical functionality. Alternatively, the pads are located only on one side in the connection opening, so that there is no point symmetry.

According to at least one embodiment, the arrangement comprises two or more than two of the receiving sockets. The receiving sockets are preferably oriented parallel to one another and/or arranged in a common plane. The receiving sockets may be mounted directly next to one another or at a distance from one another.

According to at least one embodiment, the light emitting diode or one of the light emitting diodes is inserted into two of the receiving sockets. The light emitting diode describes, in twisted or untwisted form, an arc between the two receiving sockets.

According to at least one embodiment of the arrangement, the connector is twisted through at least 180° between the associated carrier substrate and the associated receiving socket. If the organic light emitting diode is located in two different receiving sockets with two different connectors, then the organic light emitting diode as a whole may be arranged between the two associated receiving sockets in a manner twisted through at least 180° or through a multiple thereof.

According to at least one embodiment, in which the arrangement comprises at least two of the light emitting diodes, the light emitting diodes are inserted into the same receiving socket from the same direction. In this case, the receiving socket can have two connection openings, each connection opening being provided for precisely one of the organic light emitting diodes. The receiving socket is used to connect the light emitting diodes preferably electrically in series.

An organic light emitting diode as described here and an arrangement as described here are explained in more detail below with reference to the drawing on the basis of exemplary embodiments. In this case, identical reference symbols indicate identical elements in the individual figures. No scale references are shown in the figures, however, but rather individual elements may be shown in an exaggerated size to improve understanding.

FIG. 1A shows a perspective plan view, and FIG. 1B shows a perspective view from below, of an exemplary embodiment of an organic light emitting diode 1. The light emitting diode 1 comprises a carrier substrate 2 on which, in the region of an extensive, contiguous luminous area 20, an organic layer stack having an active region for producing light is mounted. The luminous area 20 is symbolized by a dashed line and has an area of at least 10 cm$^2$ for example. The carrier substrate 2 may be mechanically flexible or mechanically rigid.

At the luminous area 20, light L is emitted from the light emitting diode 1 during operation. In the case of the light emitting diode 1 shown in FIG. 1, the light L is emitted only on a front side of the carrier substrate 2. As a departure therefrom, as is also possible in all other exemplary embodiments, the organic light emitting diode 1 can additionally also emit light L on a carrier reverse 25 of the carrier substrate 2.

Figure 1:
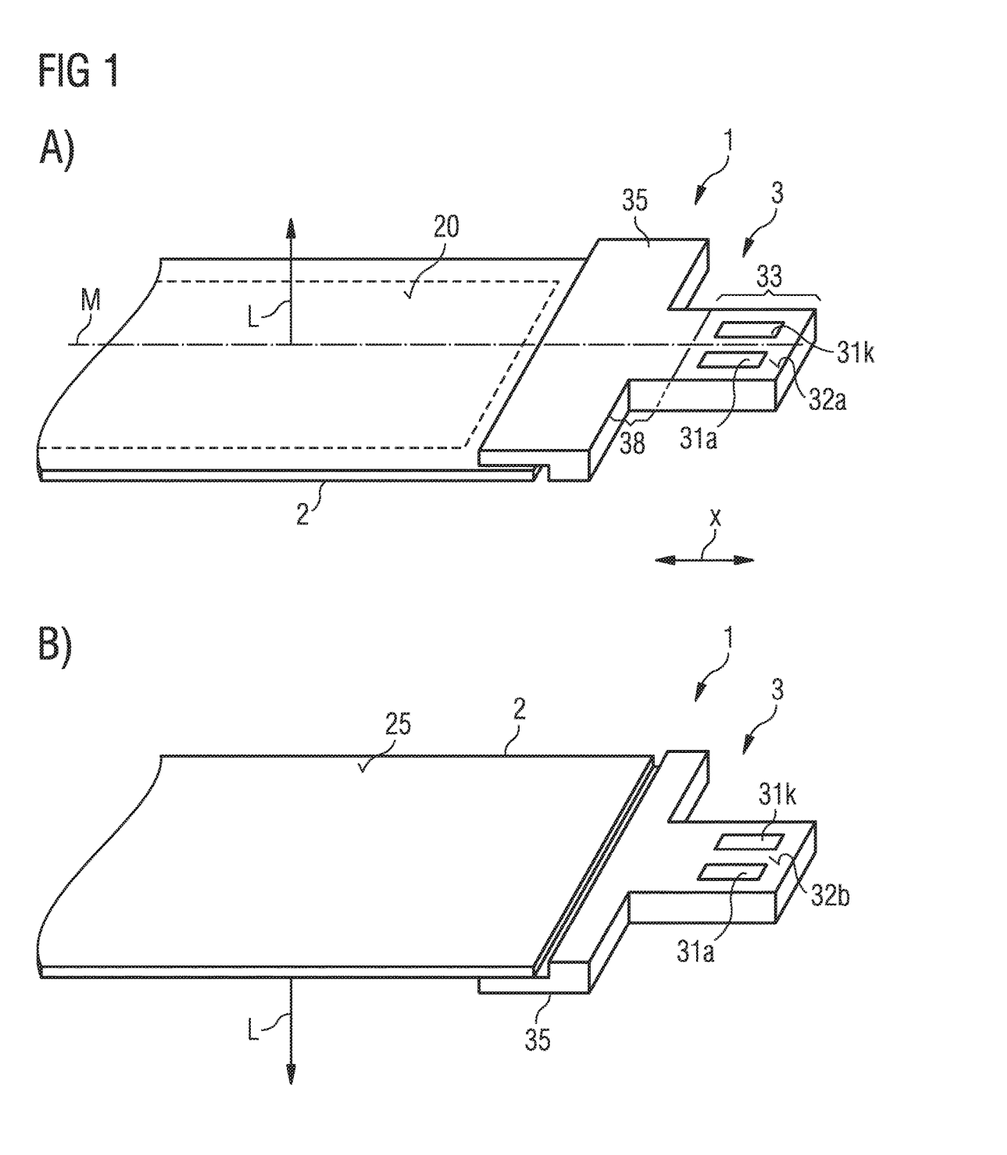
FIGS. 1, 2, 7, 10, 12 and 14 to 17 show schematic representations of exemplary embodiments of organic light emitting diodes as described here.

The carrier substrate 2 has a connector 3 mounted on it. The connector 3 allows the organic light emitting diode 1 to have external electrical and preferably also mechanical contact made with it. The connector 3 is manufactured from a printed circuit board, preferably from a flexible printed circuit board, also referred to as a flex PCB. The connector 3 may be mechanically rigid, in combination with a mechanically flexible carrier substrate 2. Similarly, the connector 3 may be mechanically flexible, with a rigid or flexible carrier substrate 2.

Located on the carrier substrate 2 is an edge strip 35 of the connector 3 from which a narrower region having an insertion region 33 extends away. The edge strip 35 is adhesively bonded to the carrier substrate 2, for example, or secured by means of an anisotropic electrically conductive adhesive film. As seen in a side view, the edge strip 35 has an L shape. In this case, the edge strip 35 partly covers one side of the carrier substrate 2 with the luminous area 20. The carrier reverse 25 is free of the edge strip 35. The edge strip 35 terminates flush with the carrier reverse 25 in a direction away from the luminous area 20. The edge strip 35 is located completely along one short side of the carrier substrate 2. The insertion region 33 is configured to be inserted into a receiving socket, not shown, completely. An insertion direction x of the connector 3 runs parallel to a long central axis M of the carrier substrate 2.

At least in the insertion region 33, the connector 3 has electrical contact pads 31a, 31k. The electrical contact pads 31a, 31k are located on two opposite main sides 32a, 32b of the connector 3. By way of example, the contact pads 31a are an anode contact of the organic layer stack, and the contact pads 31k are a cathode contact.

Figure 3:
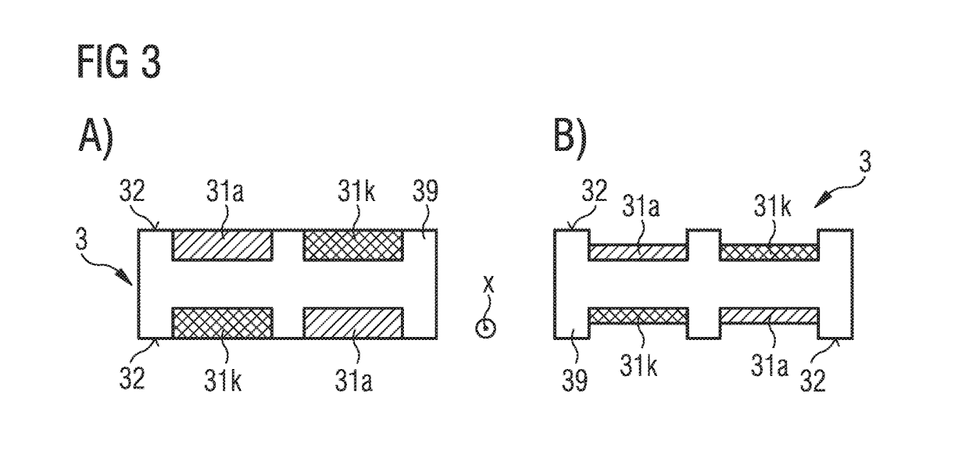
FIG. 3 shows schematic sectional representations of connectors for organic light emitting diodes as described here.

As seen in cross section, see also FIG. 3, the contact pads 31a, 31k are arranged with point symmetry. Hence, the contact pads 31a, 31k run in the same order both on the main side 32a close to the luminous area 20 and on the main side 32b close to the carrier reverse 25, as seen in plan view. Thus, both in FIG. 1a and in FIG. 1B, the front contact is provided by the contact pad 31a for the anode and the rear contact is provided by the contact pad 31k for the cathode. In other words, an order for the contact pads 31a, 31k is unchanged when the light emitting diode 1 is rotated through 180°, as seen in plan view.

On the main sides 32a, 32b, the contact pads 31a, 31k can extend to the carrier substrate 2 to different degrees for the purpose of better distinction. As in all other exemplary embodiments too, it is possible for the insertion region 33 and the edge strip 35 to merge into one another smoothly and steplessly, so that the edge strip 35 and the insertion region 33 have the same maximum thickness. Additionally, the contact pads 31a, 31k are arranged symmetrically with respect to the central axis M of the carrier substrate 2. In contrast to what is shown, the insertion region 33 can adjoin the edge strip 35 directly, or alternatively, as is the case in FIG. 1, may be spaced apart therefrom by a spacer 38.

A further exemplary embodiment of the light emitting diode is shown in a plan view in FIG. 2A, in a view from below in FIG. 2D, in a side view along a longitudinal side in FIG. 2B and in a side view in the region of the connector in FIG. 2C.

Figure 2:
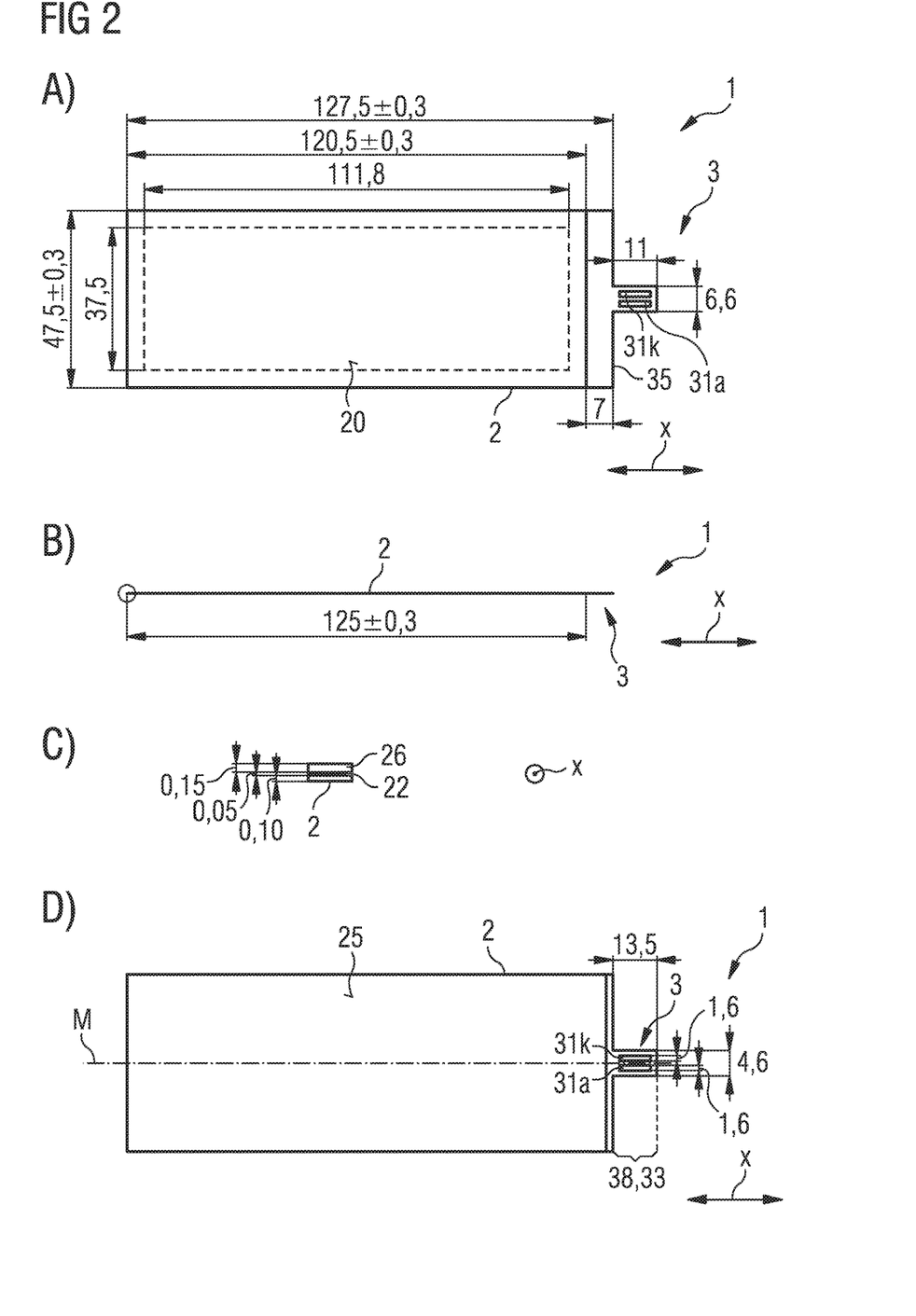

In this context, possible geometric dimensions are specified by way of example in each case. The geometric dimensions shown preferably each apply with a tolerance of no more than 50% or 25% or 10%. This can apply to all dimensions together or just to single instances of the dimensions. In addition, it is possible for the relations shown for the dimensions relative to one another to be observed with a tolerance of no more than 50% or 25% or 10% in each case. As such, by way of example, a width of the spacer 38 and of the insertion region 33 of the connector 3 is approximately 6.6 mm and a length of the spacer 38 together with the insertion region 33, starting from the edge strip 35, is 11 mm. Hence, the ratio of length to width is approximately 1.67 in this case, this preferably being observed with the cited tolerances.

According to FIG. 2C, the active region 22 with the organic layer stack for producing light is located on the carrier substrate 2. A side of the active region 22 that is remote from the carrier substrate 2 optionally has a relatively thick protective film 26 applied to it that is translucent.

FIGS. 3A and 3B show cross sectional representations of connectors 3 in the insertion region 33. In this case, the connectors 3 each have an electrically insulating base material 39 on which the contact pads 31a, 31k are applied. As shown in FIG. 3A, the contact pads 31a, 31k terminate flush with the base material 39. According to FIG. 3B, the contact pads 31a, 31k are recessed in the base material 39. Further, it is possible for the contact pads 31a, 31k to jut out from the base material 39 as elevations, not shown. In each of these cases, the main sides 32 are of flat design on average. In contrast to what is shown, it is possible for the connector 3 not to be of rectangular design in cross section, but rather to have an edge roundness.

The contact pads 31a, 31k are mounted in two layers in the flexible printed circuit board for the connector 3 and preferably wired in internally crossed-over fashion, as seen in cross section, so that the interconnection shown for the contact pads 31a, 31k is made possible on both sides.

Figure 4:
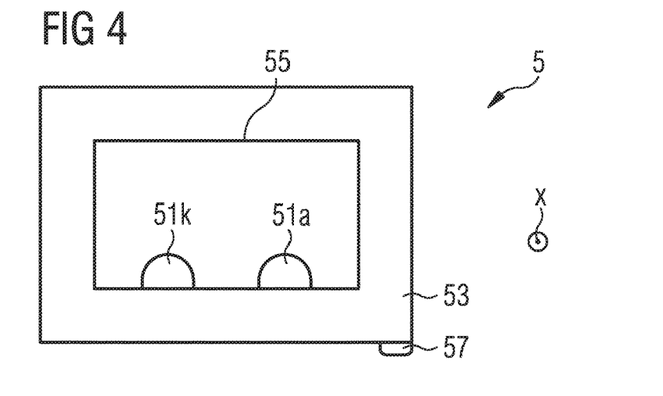
FIGS. 4, 5 and 11 show schematic representations of receiving sockets for arrangements as described here.

FIG. 4 shows a schematic plan view of a receiving socket 5 for such connectors 3. The receiving socket 5 comprises a socket housing 53 having a connection opening 55. Located in the connection opening 55 on just one side are electrical pads 51a, 51k, which are preferably in the form of an anode contact and in the form of a cathode contact. Optionally, a marking 57 may be located on the socket housing 53.

The connectors 3 of the light emitting diode 1, for example as shown in FIG. 3, can be introduced into the connection opening 55 of FIG. 4 in two different ways in terms of the outer geometric dimensions. On account of the point-symmetric arrangement of the contact pads 31a, 31k, however, these two insertion options are equivalent in terms of electrical contact connection. As a result, the connector 3 is insertable into the receiving socket 5 such that incorrect polarity is prevented.

Figure 5:
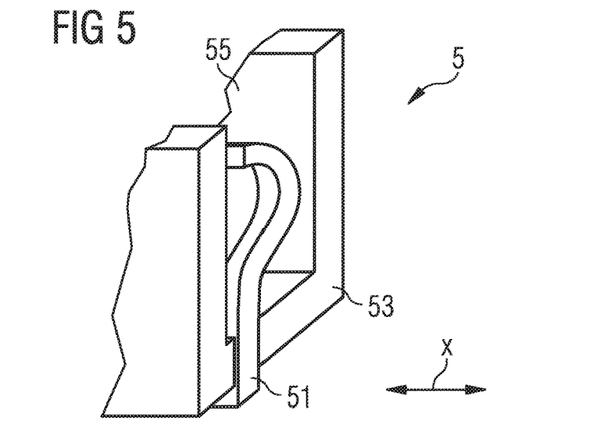

FIG. 5 illustrates that the electrical pads 51 are formed by metal springs, for example. Alternatively, it is also possible to use spring bars or pins for the pads 51.

Figure 6:
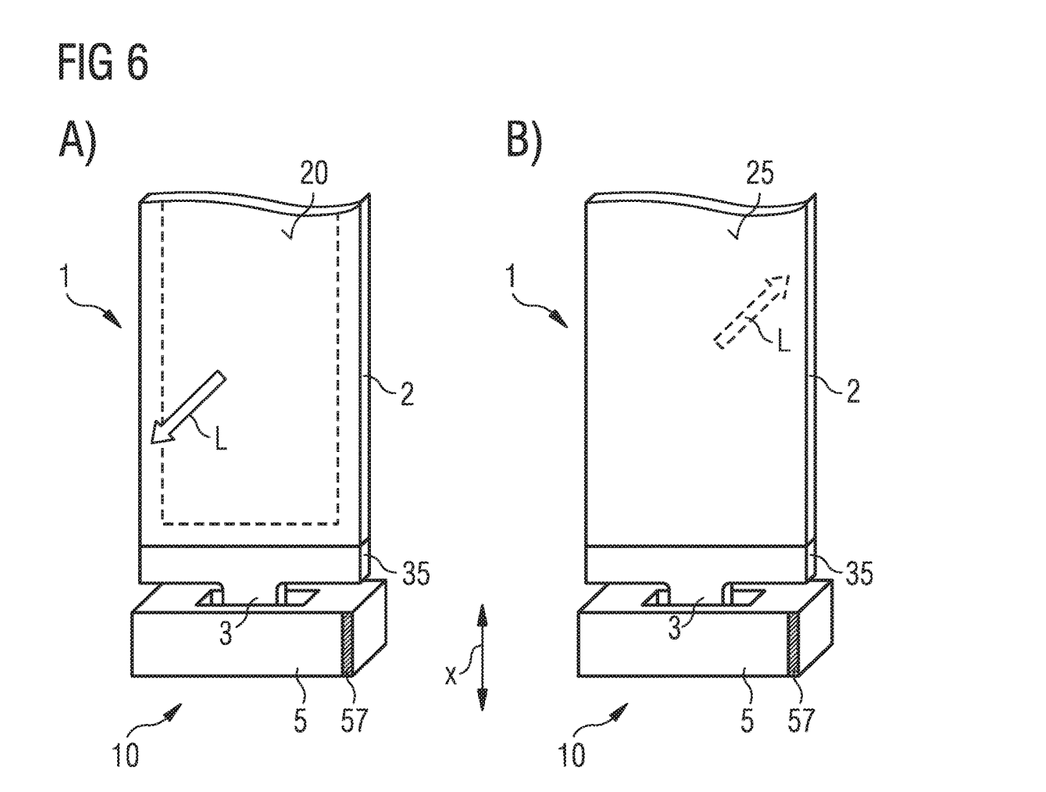
FIGS. 6, 8, 9 and 13 show schematic representations of arrangements as described here with organic light emitting diodes as described here.

FIG. 6 illustrates an arrangement 10 in perspective representations. The arrangement 10 comprises an organic light emitting diode 1 and a receiving socket 5. FIGS. 6A and 6B show each of the receiving sockets 5 in the same orientation, discernible from the marking 57, for example. In this case, the light emitting diodes 1 are inserted differently, but each have electrical contact made with them in the correct manner. According to FIG. 6A, the luminous area 20 points forward, and according to FIG. 6B, it is the carrier reverse 25. The light emitting diode 1 both has electrical contact made with it and is mechanically retained via the receiving socket 5.

Figure 7:
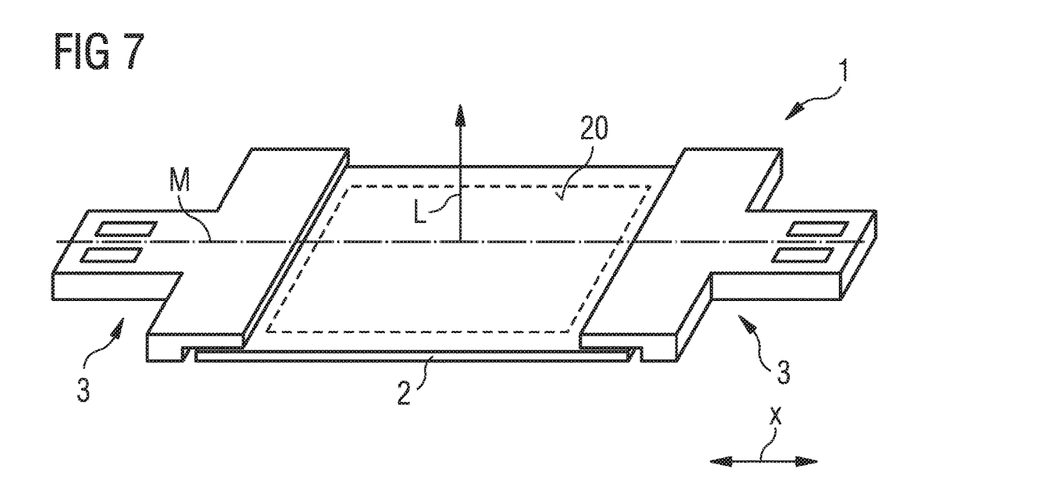

In the case of the exemplary embodiment of the organic light emitting diode 1, as shown in FIG. 7, a connector 3 is mounted on each of the two short sides of the carrier substrate 2. Both connectors 3 jut out from the carrier substrate 2, as seen in plan view, along the central axis M. Such light emitting diodes 1 are electrically connectable in series in an efficient manner via appropriate receiving sockets 5.

Figure 8:
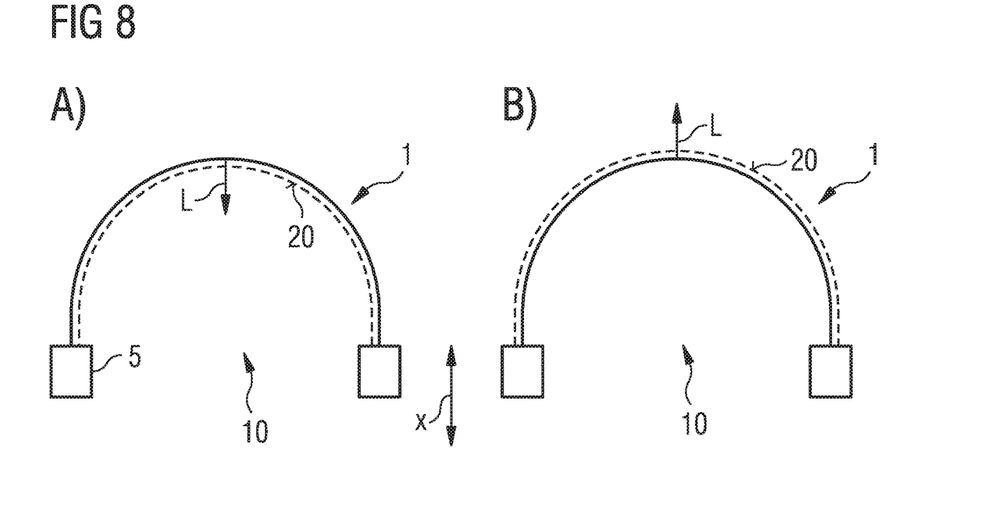

In the arrangements 10 of FIG. 8, the light emitting diode 1 arcuately spans an interspace between the two associated receiving sockets 5. In this case, the light emitting diode 1 can readily be inserted with the luminous area 20 pointing to the receiving sockets 5, see FIG. 8A, or with the luminous area 20 pointing away from the receiving sockets 5, see FIG. 8B. Since the insertion into the receiving sockets 5 is reversible and the organic light emitting diode 1 is mechanically flexible, a user can also repeatedly change between the configurations of FIGS. 8A and 8B without effort.

Figure 9:
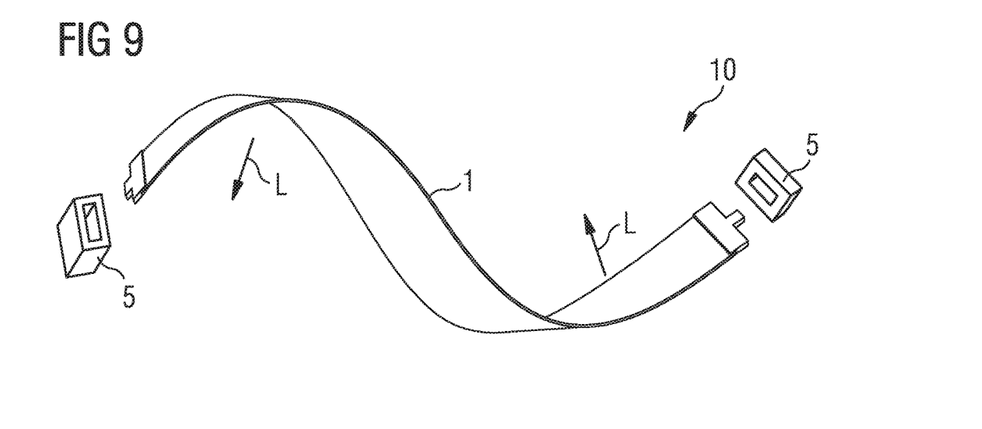

In the arrangement, as shown in FIG. 9, the organic light emitting diode 1 is arranged in a twisted manner between the two receiving sockets 5. Hence, the light emitting diode 1 is arranged in a similar manner to a Mobius strip between the two permanently installed receiving sockets 5.

In contrast to what is shown in FIG. 9, the organic light emitting diode 1 may be twisted through 180° not only once, but may also be twisted from time to time and to a greater extent.

Figure 10:
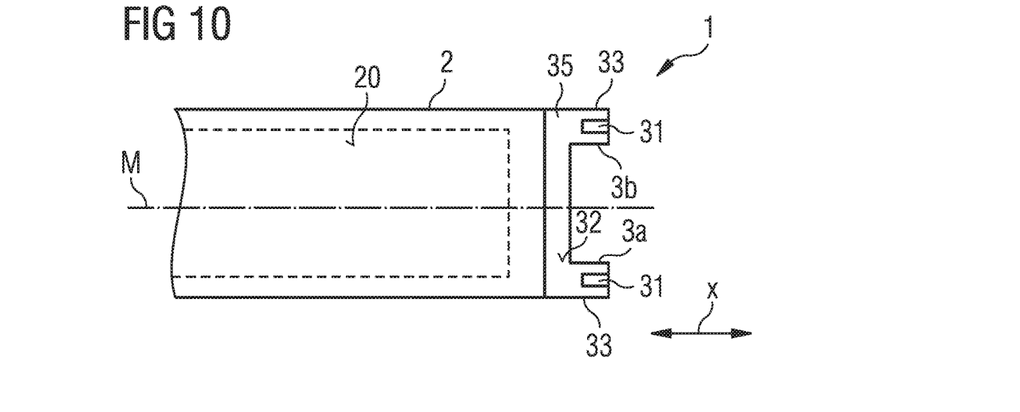

In the case of the light emitting diode 1, as shown in FIG. 10, the contact pads 31 are arranged symmetrically with respect to the central axis M and also with point symmetry as seen in a cross section. The insertion regions 33, together with the edge strip 35 and the optional spacer 38, are C-shaped as seen in plan view. Unlike in FIG. 1, for example, the connector 3 therefore has two separate insertion regions 33 that are each provided only with one of the contact pads 31 on subareas of the main sides 32. In contrast to what is shown in FIG. 10, it is not imperative for the individual insertion regions 33 to terminate flush with the carrier substrate 2 in a direction away from the central axis M. Similarly, there may be more than two insertion regions 33, which may then be of E-shaped design as seen in plan view.

Figure 11:
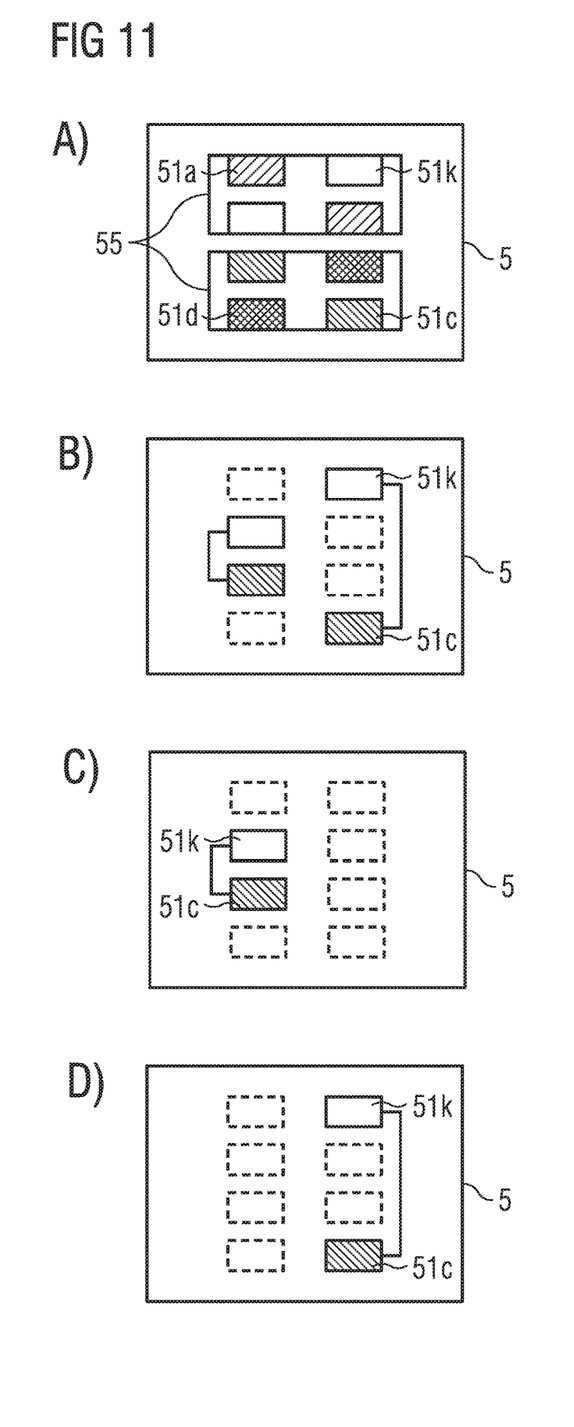

The receiving socket 5 of FIG. 11A has two of the connection openings 55, into each of which one of the light emitting diodes 1 is insertable. The pads have the functionality of first anode contacts 51a, of first cathode contacts 51k, of second anode contacts 51c and of second cathode contacts 51d. These pads can be used to electrically connect the inserted organic light emitting diodes in series, see FIGS. 11B, 11C and 11D.

According to FIG. 11B, the two first cathode contacts 31k for the first light emitting diode 1 are connected to the second anode contacts 31c for the second light emitting diode 1. In FIG. 11C, this applies only to the two pads 31c, 31k situated closer together, and in FIG. 11D, it applies only to the pads 31c, 31k situated further apart. On the basis of the design of the contact pads 31 on the connectors 3, the connection diagrams of FIGS. 11B, 11C and 11D are electrically equivalent to one another.

Figure 12:
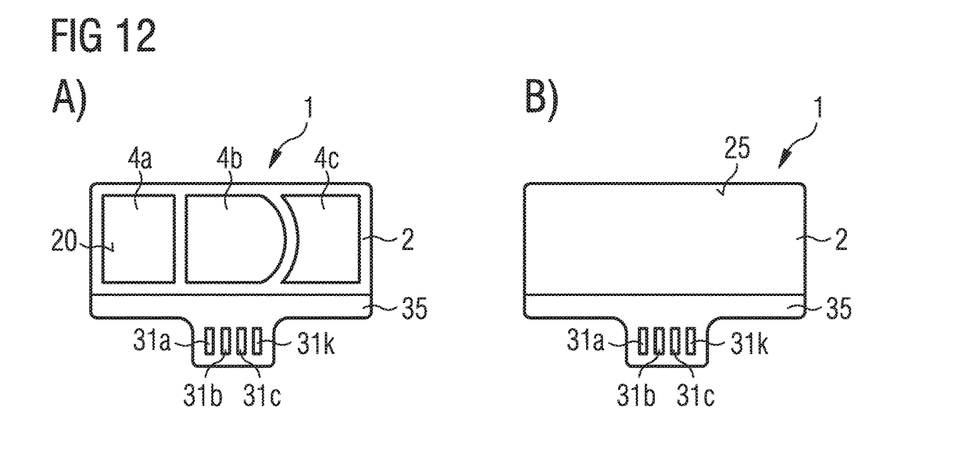

The light emitting diode 1, as shown in the plan view in FIG. 12A and in the view from below in FIG. 12B, has multiple light emitting segments 4a, 4b, 4c. The segments 4a, 4b, 4c are electrically individually actuatable via the contact pads 31a, 31b, 31c. For all segments 4a, 4b, 4c, a common cathode contact 31k is provided. In a plan view both of the luminous area 20 and of the carrier reverse 25, the contact pads 31a, 31b, 31c, 31k run from left to right in the same order.

Figure 13:
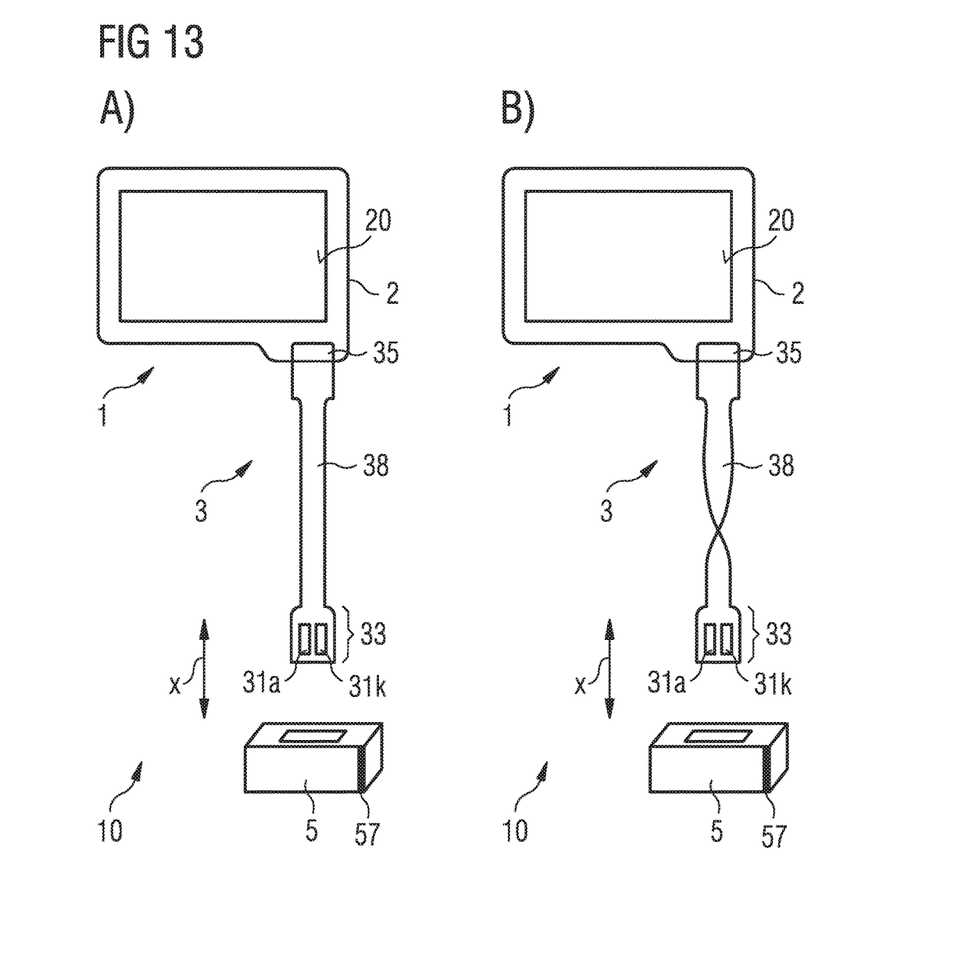

FIG. 13 shows further exemplary embodiments of the arrangement 10. In this case, the connectors 3 are of comparatively long design, so that the connectors 3 may be twisted particularly in the region of the spacer 38. The edge strip 35 is limited to a corner region of the carrier substrate 2, as is also possible in all other exemplary embodiments.

Specifically in the event of the receiving sockets 5 being situated a relatively long way from the carrier substrate 2 with the luminous area 20, it is possible for the comparatively long connectors 3 not to be readily insertable without correct association between luminous area 20 and carrier reverse 25. The arrangement of the contact pads 31a, 31k means that the orientation in which the connector 3 is inserted into the associated receiving socket 5 is not crucial for correct electrical insertion, however.

The organic light emitting diodes described here, which have the connectors according to the invention, means that prevention of incorrect polarity is implementable, which prevents damage to the organic light emitting diodes as a result of incorrect contact connection. Similarly, simple serial interconnection of multiple organic light emitting diodes is possible. It is also a simple matter to produce luminaries with organic light emitting diodes that have the same basic body on which the receiving sockets are mounted and into which in particular flexible organic light emitting diodes in different installation forms can be inserted, the associated organic light emitting diodes being able to be mounted in rotated, nonrotated, twisted or nontwisted fashion, with the luminous area 20 pointing in one or the other direction.

The simple design of the connectors and the flexible handling of the organic light emitting diodes 1, relative to the receiving socket 5, mean that significant cost savings can be involved for a luminarie manufacturer. The simple option of being able to insert the organic light emitting diode in a manner twisted through 180° means that there is no longer a need to distinguish between what are known as bottom emitters or top emitters that emit on one side, as a result of which it is possible to replace and use organic light emitting diodes 1 of different construction without great effort. In the case of what is known as a bottom emitter, the light is emitted through the carrier substrate 2, and in the case of what is known as a top emitter, the carrier substrate 3 is usually nontranslucent and/or reflective.

Figure 14:
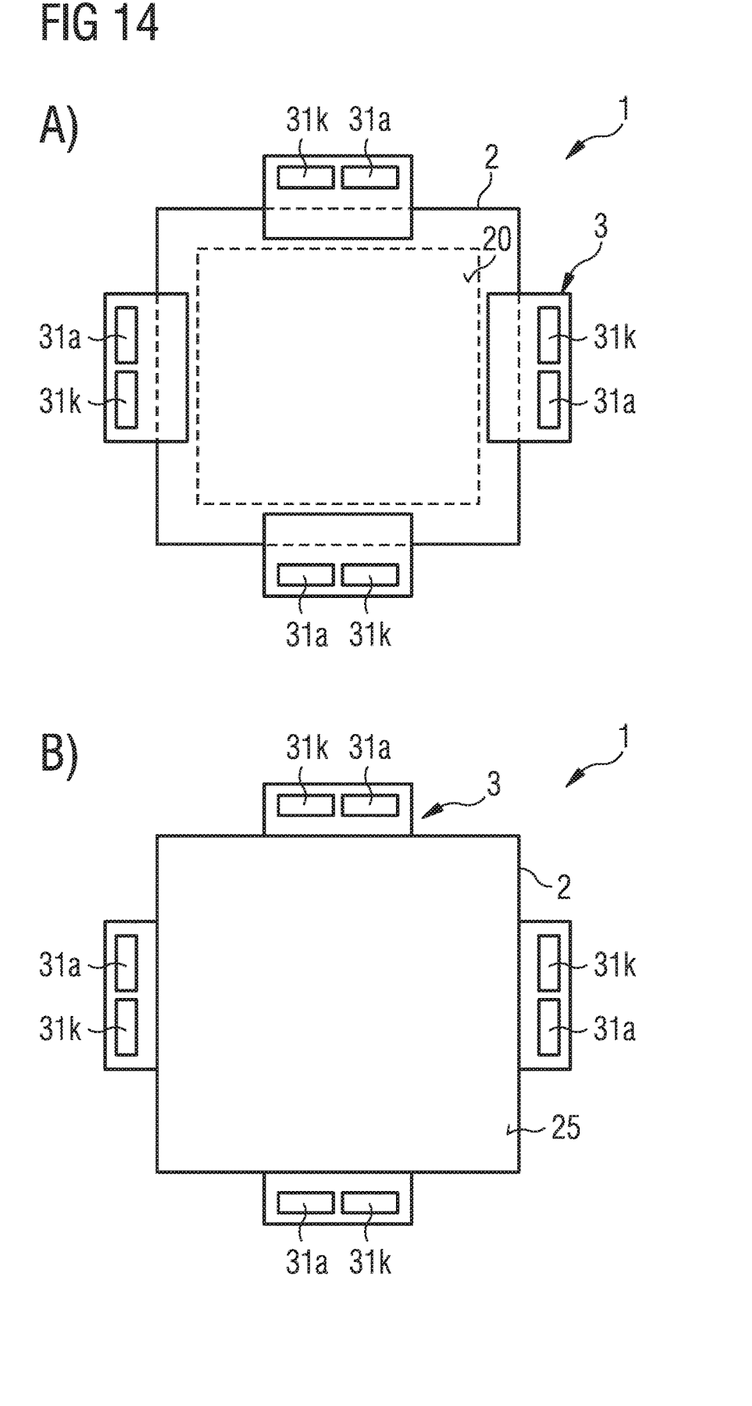

In the exemplary embodiment of the light emitting diode 1, as shown in FIG. 14, the carrier substrate 2 has a square or rectangular base. The connectors 3 are preferably located centrally, or alternatively eccentrically, on each of the sides of the carrier substrate 2, as seen in plan view. In this arrangement, the contact pads 31a, 31k are mappable to one another both by means of a rotation through 90° or 180° about an axis perpendicular to the plane of the drawing and to the luminous area 20 in FIG. 14 and preferably by means of a rotation through 180° about an axis parallel to the luminous area 20, particularly about a central axis, which is not shown. A sequence for the contact pads 31a, 31k of each connector 3 is always the same in this case, regardless of whether seen from the luminous area 20 or from the carrier reverse 25.

Figure 15:
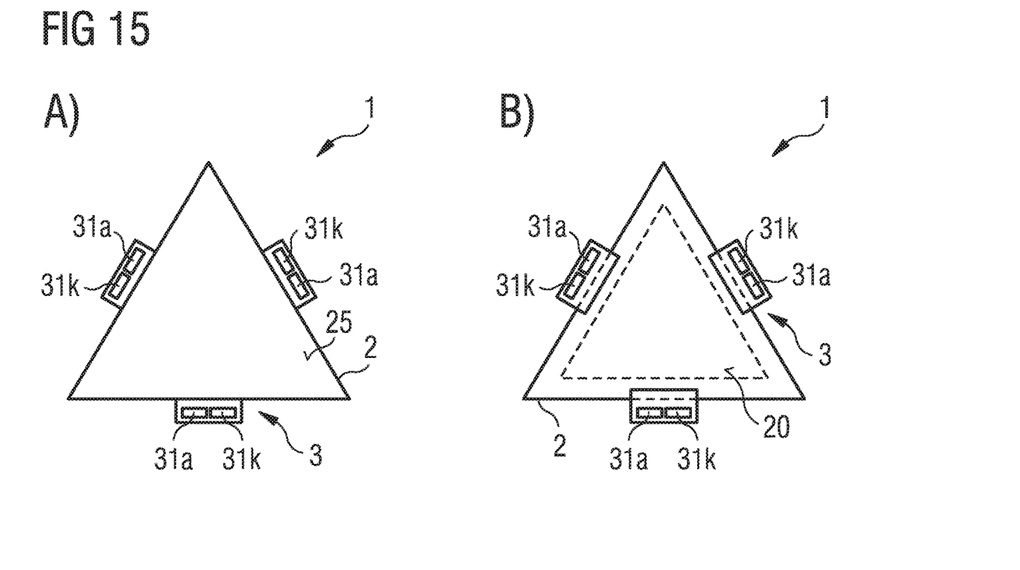

According to FIG. 15, the light emitting diode 1, as seen in plan view, is designed as a triangle, preferably as an equilateral triangle. As also in FIG. 14, the sequence of the contact pads 31a, 31k of each connector 3 is always the same in this case, as seen both from the luminous area 20 and from the carrier reverse 25. Preferably, the connectors 3 are mappable to one another by means of a rotation through 120° about an axis perpendicular to the plane of the drawing and to the luminous area 20.

Figure 16:
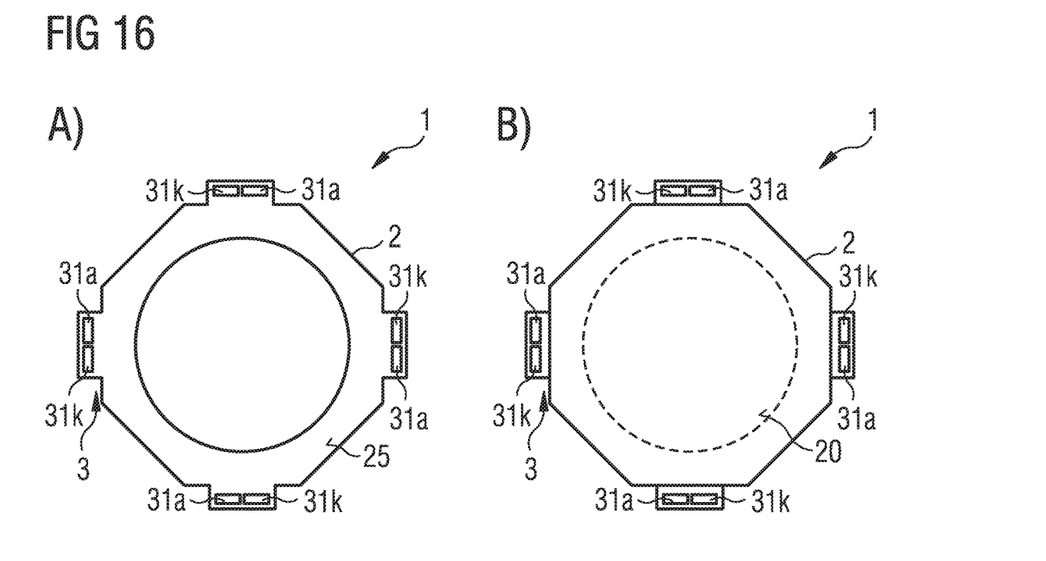

In the exemplary embodiment of FIG. 16, the carrier substrate 2, as seen in plan view, is shaped as an octagon, particularly as a regular octagon. The luminous area 20 is of circular design. For the connectors 3, preferably the same applies as indicated for FIG. 14.

According to FIG. 16, all connectors 4 are of integral design from a single, in particular flexible, printed circuit board. A corresponding situation can also apply to all other exemplary embodiments. In this case, the printed circuit board revolves all around the carrier substrate 2 in a closed loop, as seen in plan view.

In the exemplary embodiments of FIGS. 14 to 16 too, the insertion regions of the connectors 3 may, as a departure from the representations, be split into multiple subareas in similar fashion to FIG. 10.

Figure 17:
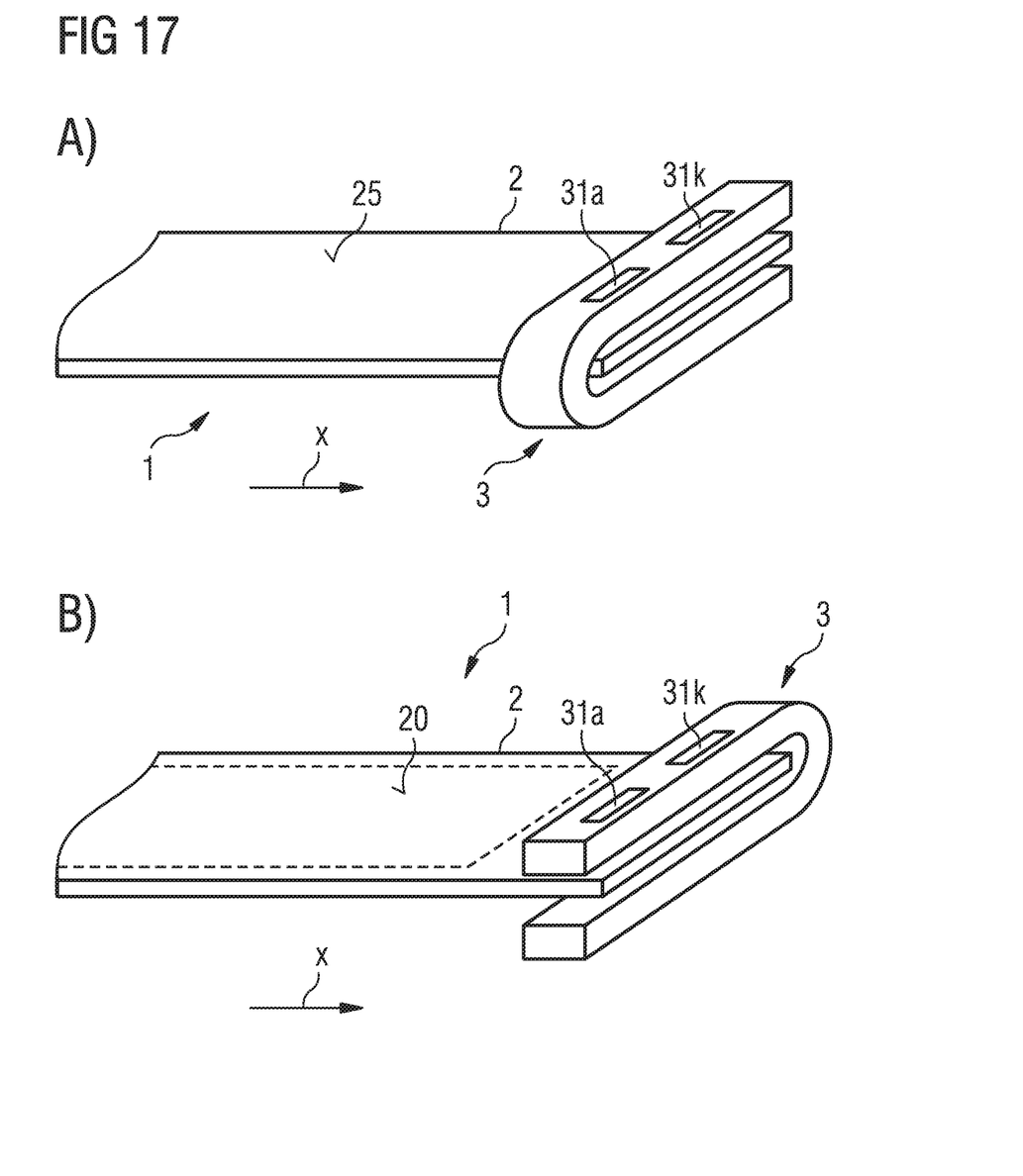

FIG. 17 shows a further exemplary embodiment. In this case, the connector 3 terminates flush with the carrier substrate 2, along the insertion direction x. The insertion region of the connector 3 accordingly overlaps the carrier substrate 2, as seen in plan view. That is to say that both the connector 3 and the carrier substrate 2 are configured to be introduced into a receiving socket, not shown.

The printed circuit board from which the connector 3 is integrally formed is folded and bent over a lateral face of the carrier substrate 2 from the luminous area 20 to the reverse 25. As seen in cross section, the printed circuit board and the connector 3 are therefore of U-shaped design around the carrier substrate 2 in places. According to FIG. 17, the printed circuit board is in this case folded around a lateral face that is oriented parallel to the insertion direction x. Alternatively, the printed circuit board may also cover a lateral face perpendicular to the insertion direction x, however. As a departure from the representation in FIG. 17, it is not absolutely necessary for the connector 3 to extend along the whole side of the carrier substrate 2, transversely with respect to the insertion direction x.

The invention described here is not limited by the description on the basis of the exemplary embodiments. Rather, the invention comprises any new feature and any combination of features, which includes particularly any combination of features in the patent claims, even if this feature or this combination is itself not explicitly specified in the patent claims and exemplary embodiments.

This patent application claims the priority of German patent application 10 2015 117 486.3, the disclosure content of which is hereby incorporated by reference.

LIST OF REFERENCE SYMBOLS

1 Organic light emitting diode
2 Carrier substrate
20 Luminous area
22 Active region
25 Carrier reverse
26 Protective film
3 Connector
31 Electrical contact pad of the connector
31a Anode
31k Cathode
32 Main side of the connector
33 Insertion region of the connector
35 Edge strip
38 Spacer
39 Base material
4 Light-emitting segment of the light emitting diode
5 Receiving socket
51 Electrical pad of the receiving socket
53 Socket housing
55 Connection opening
57 Marking
10 Arrangement
L Light
M Central axis of the carrier substrate
x Insertion direction of the connector

The invention claimed is:

1. An organic light emitting diode comprising:
a carrier substrate having an organic layer stack for producing light, and
at least one connector configured to electrically connect to the light emitting diode,
wherein the connector has two main sides situated opposite one another, each main side having at least two electrical contact pads of the connector located thereon,
wherein as seen in a cross section perpendicular to the main sides and perpendicular to an insertion direction of the connector, the contact pads are arranged both geometrically and with electrical point symmetry, to provide protection against incorrect polarity and incorrect electrical connection, and
wherein the connector is configured to be twisted.

2. The organic light emitting diode according to claim 1, wherein both the carrier substrate and the connector are mechanically flexible, with a bending radii of 40 mm or less with respect to nondestructive and reversible bending.

3. The organic light emitting diode according to claim 1, wherein the connector is mounted along and on a central axis of the carrier substrate, wherein a contour of the carrier substrate, together with the connector, as seen in plan view, remains unchanged upon a rotation about the central axis through 180°.

4. The organic light emitting diode according to claim 3, comprising precisely two of the connectors, which, as seen in plan view, jut out from the carrier substrate along the central axis on sides that are situated opposite one another.

5. The organic light emitting diode according to claim 1, comprising multiple electrically individually actuatable light emitting segments, wherein there are, for each of the segments, two contact pads that are arranged with point symmetry, as seen in cross section, and are configured to individually actuate the associated segment.

6. The organic light emitting diode according to claim 1, wherein at least one of the connectors juts out from the carrier substrate by threat least 20 times an average width of this connector, as seen in plan view, so that the connector has the design of a ribbon cable and so that the connector can be twisted in a nondestructive and reversible manner through at least 360° about an axis of rotation parallel to the insertion direction.

7. The organic light emitting diode according to claim 1, wherein at least one of the connectors juts out from the carrier substrate by at least ten times an average width of this connector, as seen in plan view, so that this connector is twistable in a nondestructive manner through at least 180° about an axis of rotation parallel to the insertion direction.

8. The organic light emitting diode according to claim 1, wherein the connector contains precisely one single insertion region that is configured to be inserted into a receiving socket completely,
wherein the insertion region comprises all contact pads, and extends in a constant, invariable manner along the insertion direction and consists of precisely one, contiguous flexible printed circuit board.

9. The organic light emitting diode according to claim 1, wherein, at least in an insertion region of the connector, the connector has an electrically insulating base material whose two flat main sides situated opposite one another have the contact pads applied to them as raised material deposits.

10. The organic light emitting diode according to claim 1, wherein the connector is of one piece design from a printed circuit board and is U shaped as seen in at least one cross section, so that the carrier substrate is, in places, located between two regions of the connector, and the printed circuit board is folded over a lateral face of the carrier substrate, wherein the insertion region of the connector overlaps the carrier substrate, as seen in plan view.

11. An arrangement further comprising at least one organic light emitting diode according to claim 1 and having at least one receiving socket, wherein the light emitting diode is mechanically retained, and in electrical contact, via the receiving socket, the light emitting diode being inserted into the receiving socket in a reversible manner and to prevent incorrect polarity.

12. The arrangement according to claim 11, further comprising at least two of the receiving sockets, and the receiving sockets are mounted so as to be oriented parallel to one another in a common plane, wherein the light emitting diode describes an arc between the two receiving sockets, and wherein electrical pads of the receiving socket, as seen in a plan view of a connection opening of the receiving socket, are arranged with point symmetry.

13. The arrangement according to claim 11, wherein the connector is twisted through at least 180° between the associated carrier substrate and the associated receiving socket.

14. The arrangement according to claim 11, further comprising at least two of the light emitting diodes, wherein the light emitting diodes are inserted into the same receiving socket from the same direction and are electrically connected in series.

15. An organic light emitting diode comprising:
a carrier substrate having an organic layer stack for producing light, and
at least one connector configured to electrically connect to the light emitting diode,
wherein the connector has two main sides situated opposite one another, each main side having at least two electrical contact pads of the connector located thereon,
wherein as seen in a cross section perpendicular to the main sides and perpendicular to an insertion direction of the connector, the contact pads are arranged both geometrically and with electrical point symmetry, to provide protection against incorrect polarity and incorrect electrical connection.

16. The organic light emitting diode according to claim 15, wherein at least one of the connectors juts out from the carrier substrate by no more than three times an average width of this connector, as seen in plan view.

* * * * *